(12) United States Patent
Lim et al.

(10) Patent No.: US 8,926,871 B2
(45) Date of Patent: Jan. 6, 2015

(54) HYBRID METAL OXIDE AND METHOD OF FORMING THE SAME, AND SOLAR CELL INCLUDING THE SAME

(71) Applicant: Samsung Electronics Co., Ltd., Suwon-Si (KR)

(72) Inventors: Younhee Lim, Hwaseong-si (KR); Yeong Suk Choi, Suwon-si (KR); Soo Ghang Ihn, Hwaseong-si (KR); Jong Hyeok Park, Suwon-si (KR); Jung Kyu Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 13/857,367

(22) Filed: Apr. 5, 2013

(65) Prior Publication Data
US 2013/0263919 A1    Oct. 10, 2013

(30) Foreign Application Priority Data
Apr. 5, 2012    (KR) .................. 10-2012-0035653

(51) Int. Cl.
*H01B 1/08*    (2006.01)
*B05D 5/12*    (2006.01)
*H01L 35/24*    (2006.01)
*H01L 51/42*    (2006.01)
*H01L 31/0216*  (2014.01)

(52) U.S. Cl.
CPC ........ *H01L 31/02167* (2013.01); *H01L 51/422* (2013.01); *H01L 51/4273* (2013.01); *H01L 51/4253* (2013.01); *Y02E 10/549* (2013.01)
USPC .................. 252/518.1; 252/520.2; 252/521.3; 136/252

(58) Field of Classification Search
CPC .......... H01B 1/08; C23C 1/08; C01G 23/053; C09D 5/00; C09D 5/24; C07B 41/00; H01L 35/14; B05D 5/00
USPC ........... 252/500, 518.1, 520.2, 521.3; 427/58, 427/126.3; 136/252-256
See application file for complete search history.

(56) References Cited

U.S. PATENT DOCUMENTS

| 7,052,718 | B2 * | 5/2006 | Nakade et al. ................ 424/489 |
| 8,778,227 | B2 * | 7/2014 | Mataki et al. ............ 252/301.4 F |
| 2006/0292736 | A1 | 12/2006 | Lee et al. |
| 2008/0022896 | A1 | 1/2008 | Karkkainen |
| 2009/0163647 | A1 * | 6/2009 | DeLuca et al. ................ 524/588 |

(Continued)

FOREIGN PATENT DOCUMENTS

| KR | 2009-0020516 A | 2/2009 |
| KR | 2009-0029675 A | 3/2009 |

OTHER PUBLICATIONS

Korean Search Report, mailed Dec. 2011 (No English language translation).

*Primary Examiner* — Mark Kopec
(74) *Attorney, Agent, or Firm* — Harness, Dickey & Pierce, P.L.C.

(57) ABSTRACT

According to example embodiments, a hybrid metal oxide having a network structure includes an oxygen atom that is covalently bonded to a first metal and a second metal. At least one of the first metal and the second metal has two or more oxidation states. A solar cell may have an interlayer including the hybrid metal oxide. According to example embodiments, a hybrid metal oxide may be formed using a sol-gel process from a solution including a first metal precursor and a second metal precursor.

25 Claims, 6 Drawing Sheets

(56) References Cited

U.S. PATENT DOCUMENTS

2010/0193034 A1 8/2010 Lee et al.
2011/0056547 A1 3/2011 Lee et al.
2011/0139237 A1 6/2011 Peter
2011/0168249 A1 7/2011 Lee et al.

* cited by examiner

HYBRID METAL OXIDE AND METHOD OF FORMING THE SAME, AND SOLAR CELL INCLUDING THE SAME

CROSS-REFERENCE TO RELATED APPLICATION

This application claims priority under 35 U.S.C. §119 to Korean Patent Application No. 10-2012-0035653 filed in the Korean Intellectual Property Office on Apr. 5, 2012, the entire contents of which are incorporated herein by reference.

BACKGROUND

1. Field

Example embodiments relate to hybrid metal oxide, a method of forming the same, and/or a solar cell including the hybrid metal oxide.

2. Description of the Related Art

A solar cell may include a photoelectric conversion device that transforms solar energy into electrical energy. Solar cells have attracted attention as an infinite but pollution-free next generation energy source.

A solar cell may include p-type and n-type semiconductors. A solar cell may generate electrical energy by transferring electrons and holes to the n-type and p-type semiconductors, respectively, and then collecting electrons and holes in each electrode when an electron-hole pair (EHP) is generated by solar light energy absorbed in a photoactive layer that includes the n-type and p-type semiconductors.

In order to have high efficiency, a solar cell ideally may absorb light effectively to generate as many electron-hole pairs as possible, and then collect the generated charges with as little charge loss as possible. In order to decrease charge loss, an interlayer may be between a photoactive layer and an electrode of a solar cell.

SUMMARY

Example embodiments relate to a hybrid metal oxide.

Example embodiments also relate to a method of forming a hybrid metal oxide.

Example embodiments also relate to a solar cell including the hybrid metal oxide.

According to example embodiments, a hybrid metal oxide has a network structure including an oxygen atom that is covalently bonded to a first metal and a second metal linked. The first metal and the second metal may be different from each other. At least one of the first metal and the second metal has two or more oxidation states.

In example embodiments, the hybrid metal oxide may be represented by the following Chemical Formula 1.

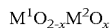   [Chemical Formula 1]

In Chemical Formula 1,
M$^1$ is the first metal,
M$^2$ is the second metal, and
$0.01 \leq x \leq 0.99$.

In example embodiments, at least one of the first metal and the second metal may have at least two oxidation states selected from divalence, trivalence, and tetravalence. Additionally, at least one of the at least two oxidation states may be a conductive oxidation state.

In example embodiments, the second metal may have two or more oxidation states, and the second metal may be included in an amount of about 0.1 mol % to about 50 mol % based on a total amount of the first metal and the second metal.

In example embodiments, the hybrid metal oxide may have at least one amorphous part.

In example embodiments, the first metal and the second metal may be independently different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

In example embodiments, the first metal may be titanium (Ti) and the second metal may be silicon (Si).

In example embodiments, the silicon (Si) may have trivalent and tetravalent oxidation states, and the silicon (Si) may be included in an amount of about 0.1 to about 50 mol % based on a total amount of the titanium (Ti) and silicon (Si).

In example embodiments, the hybrid metal oxide may have a conductivity of about $10^{-6}$ to about 10 S/cm.

In example embodiments, the hybrid metal oxide may have a work function of about 3.0 to about 8.5 eV.

According to example embodiments, a method includes preparing a solution including a first metal precursor and a second metal precursor, and forming the foregoing hybrid metal oxide from the solution through a sol-gel process.

In example embodiments, the preparing the solution may include: preparing a first solution including the first metal precursor and a first acid catalyst, preparing a second solution including the second metal precursor and a second acid catalyst, and mixing the first solution and the second solution.

In example embodiments, the method may further include heat-treating the solution at about 30 to about 70° C.

In example embodiments, the second metal may have two or more oxidation states, and the second metal precursor may be included in an amount of about 0.1 mol % to about 50 mol % based on a total amount of the first metal precursor and the second metal precursor.

In example embodiments, the first metal and the second metal may independently be different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

In example embodiments, the first metal may be titanium (Ti) and the second metal may be silicon (Si). The silicon (Si) may have trivalent and tetravalent oxidation states.

According to example embodiments, a solar cell includes an anode, a cathode on the anode, a photoactive layer between the anode and the cathode, and an interlayer between the cathode and the photoactive layer. The interlayer includes a hybrid metal oxide having a network structure including an oxygen atom that is covalently bonded to a first metal and a second metal. The first metal and the second metal may be different from each other. At least one of the first metal and the second metal may have two or more oxidation states.

In example embodiments, the hybrid metal oxide may be represented by Chemical Formula 1.

In example embodiments, at least one of the first metal and the second metal may have at least two oxidation states selected from divalence, trivalence, and tetravalence, and at least one of the at least two oxidation states may be a conductive oxidation state.

In example embodiments, the second metal may have two or more oxidation states, and the second metal may be included in an amount of about 0.1 mol % to about 50 mol % based on a total amount of the first metal and the second metal.

In example embodiments, the hybrid metal oxide may have at least one amorphous part.

In example embodiments, the first metal and the second metal may independently be different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

In example embodiments, the first metal may be titanium (Ti) and the second metal may be silicon (Si).

In example embodiments, the silicon (Si) may have a trivalent and tetravalent oxidation state, and the silicon (Si) may be included in an amount of about 0.1 to about 50 mol % based on the total amount of the titanium (Ti) and silicon (Si).

In example embodiments, the interlayer may have conductivity of about $10^{-6}$ to about 10 S/cm.

In example embodiments, the interlayer may have a bandgap of about 3.0 to about 8.5 eV.

In example embodiments, the photoactive layer may include an electron donor including a polymer and an electron acceptor including fullerene or a fullerene derivative.

According to example embodiments, a hybrid metal oxide includes a plurality of first metal atoms, a plurality of second metal atoms, and a plurality of oxygen atoms. The first and second metal atoms may be different. At least one of the first metal atoms and the second metal atoms may have two or more oxidation states. A first portion of the plurality of oxygen atoms may each be covalently bonded to a corresponding one of the plurality of first metal atoms and a corresponding one of the plurality of second atoms.

In example embodiments, the first metal may be titanium (Ti) and the second metal may be silicon (Si). In example embodiments, the silicon (Si) may have trivalent and tetravalent oxidation states, and the silicon (Si) may be included in an amount of about 0.1 to about 50 mol % based on a total amount of the titanium (Ti) and silicon (Si).

In example embodiments, a second portion of the plurality of oxygen atoms are each covalently bonded to a corresponding two of the plurality two of the plurality of first metal atoms, and a third portion the plurality of oxygen atoms are each covalently bonded to a corresponding two of the plurality of second metal atoms.

In example embodiments, the first metal and the second metal may independently be different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

In example embodiments, a solar cell may include a cathode on an anode, a photoactive layer between the anode and the cathode, and an interlayer between the cathode and the photoactive layer. The interlayer may include the foregoing hybrid metal oxide.

BRIEF DESCRIPTION OF THE DRAWINGS

The foregoing and other features and advantages of example embodiments will be apparent from the more particular description of non-limiting embodiments, as illustrated in the accompanying drawings. The drawings are not necessarily to scale, emphasis instead being placed upon illustrating principles of example embodiments. In the drawings.

DETAILED DESCRIPTION

Figure 1:
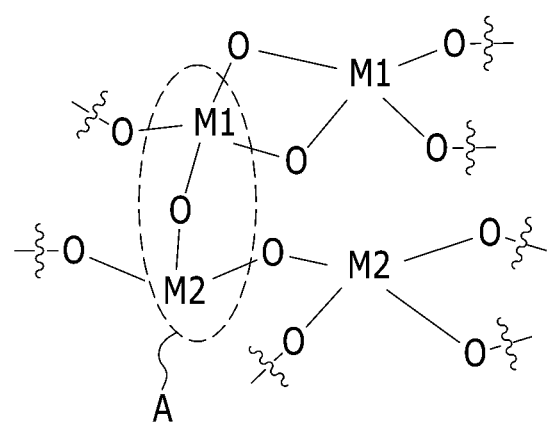
FIG. 1 is a schematic view showing a hybrid metal oxide according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Other words used to describe the relationship between elements or layers should be interpreted in a like fashion (e.g., "between" versus "directly between," "adjacent" versus "directly adjacent," "connected" versus "directly connected").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the term "metal" may refer to a metal or a semi-metal.

Hereinafter, a hybrid metal oxide according to example embodiments is illustrated.

The hybrid metal oxide according to example embodiments may have a network structure including a first metal, oxygen atom, and a second metal linked through a covalent bond. In other words, the hybrid metal oxide may include an oxygen atom that is covalently bonded to a first metal and a second metal.

The hybrid metal oxide may be, for example, represented by the following Chemical Formula 1.

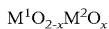 [Chemical Formula 1]

In Chemical Formula 1,
$M^1$ is a first metal,
$M^2$ is a second metal, and
x is in a range of $0.01 \leq x \leq 0.99$.

In the hybrid metal oxide, at least one of the first metal and the second metal may have two or more oxidation states.

The oxidation state may indicate a degree of oxidation of the first metal and the second metal in the hybrid metal oxide, and the hybrid metal oxide may have conductivity or non-conductivity depending on an oxidation state. For example, in the hybrid metal oxide, a metal having a neutral oxidation state may have non-conductivity, whereas a metal having a relatively lower oxidation state than the neutral oxidation state has a broken valence and may accept a greater charge therein, and thus shows conductivity.

In the hybrid metal oxide, the at least one of the first metal and the second metal may have, for example, at least two oxidation states selected from divalence, trivalence, and tetravalence, and at least one of the at least two oxidation states may have conductive properties.

FIG. 1 is a schematic view showing a hybrid metal oxide according to example embodiments.

Referring to FIG. 1, the hybrid metal oxide having the network structure includes a part "A" where the first metal ($M^1$), oxygen atom (O), and the second metal ($M^2$) are linked through a covalent bond. In other words, an oxygen atom (O) may be covalently bonded to the first metal ($M^1$) and the second metal ($M^2$). At least one of the first metal ($M^1$) and second metal ($M^2$) of the hybrid metal oxide may have two or more oxidation states.

For example, the hybrid metal oxide of FIG. 1 simultaneously includes the second metal ($M^2$) having a tetravalent oxidation state and linked to four oxygen atoms (O), and the second metal ($M^2$) having a trivalent oxidation state and linked to three oxygen atoms (O). The trivalent second metal ($M^2$) has insufficient cations, and thus has a charge. Accordingly, the hybrid metal oxide including the second metal ($M^2$) may have a charge conductivity and may cause changes of an energy level and a bandgap. Considering such changes of energy level and bandgap, the hybrid metal oxide may have selectively adjusted carrier mobility of electrons and holes. For example, the hybrid metal oxide may have an energy level adapted to an interlayer between the cathode and an n-type semiconductor while having an enlarged bandgap, and thus effectively reduces (and/or blocks) the transfer of holes.

The hybrid metal oxide including a metal having two or more oxidation states may be obtained through a sol-gel process.

In general, since a metal oxide including one kind of metal may have a constant oxidation state, it may be hard to control the conductivity of the metal oxide. In example embodiments, by including at least two kinds of metals and being formed through a sol-gel process, a composition ratio of precursors of the metals may be controlled and thereby at least one of the metals may have two or more oxidation states.

For example, when a metal having two or more oxidation states is a second metal, the second metal may be included in an amount of less than or equal to about 50 mol %, based on the total amount of the first metal and the second metal. Within the above range, a binding proportion ratio between heterogeneous atoms may be increased, and a part where the first metal, oxygen atom, and the second metal are linked through a covalent bond may be formed. Within the above range, the second metal may have two or more oxidation states including a conductive oxidation state. Within the above range, the second metal may be included in an amount of about 0.1 to about 50 mol %.

The first metal and second metal may be any metal being capable of binding with oxygen atom to form a metal oxide, without limitation.

The first metal and second metal may be different from each other, and may be independently selected from titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn), but are not limited thereto.

For example, when the first metal is titanium (Ti) and the second metal is silicon (Si), the silicon (Si) may be included in an amount of about 0.1 to about 50 mol % based on the total amount of titanium (Ti) and silicon (Si). When the silicon (Si) is included within the above range, the silicon (Si) may simultaneously have a conductive trivalent and non-conductive tetravalent oxidation states. Herein, as the amount of silicon (Si) becomes low, the silicon (Si) tends to be more reduced, and accordingly a ratio of silicon (Si) having a conductive trivalent oxidation state may increase. Within the above range, the silicon (Si) may be included in an amount of about 0.1 to about 50 mol % based on the total amount of titanium (Ti) and silicon (Si).

At least one part of the hybrid metal oxide may be amorphous.

The hybrid metal oxide may have, for example, conductivity of about $10^{-6}$ to about 10 S/cm. By having conductivity within the above range, the hybrid metal oxide may be applied to an interlayer of a solar cell, and thus increase charge mobility of a charge transferred from a photoactive layer to an electrode.

The hybrid metal oxide may have a bandgap of about 3.0 to about 8.5 eV. Within the above range, an energy level between a photoactive layer and an electrode of a solar cell may be controlled and charge mobility may be increased.

The hybrid metal oxide may be formed through a sol-gel process using a metal precursor.

According to example embodiments, a method of forming a hybrid metal oxide includes preparing a solution including a first metal precursor and a second metal precursor and forming a hybrid metal oxide from the solution through a sol-gel process, wherein the hybrid metal oxide has a network structure including a first metal, oxygen atom, and a second metal linked through a covalent bond. In other words, the hybrid metal oxide may include an oxygen atom that is covalently bonded to a first metal and a second metal.

The first metal precursor and the second metal precursor may independently be, for example, metal salts such as an alkoxide, a hydroxide, a citrate, an acetate, a carbonate, a (meth)acrylate, a nitrate, an acetylacetonate, a halide, a thiocarbamate, a sulfonate, and a hydrate thereof, but are not limited thereto.

The first metal precursor and the second metal precursor may be mixed in a solvent and prepared as a solution. Herein, the first metal precursor and the second metal precursor may be individually prepared in individual solutions, or one of the first metal precursor and second metal precursor may be added to a solution including at least one of the first metal precursor and the second metal precursor.

The solvent may be any solvent being capable of dissolving or dispersing the above components without limitation, and may be at least one selected from, for example, deionized water, methanol, ethanol, propanol, isopropanol, 2-methoxyethanol, 2-ethoxyethanol, 2-propoxyethanol 2-butoxyethanol, methyl cellosolve, ethyl cellosolve, diethylene glycol methyl ether, diethylene glycol ethyl ether, dipropylene glycol methyl ether, toluene, xylene, hexane, heptane, octane, ethylacetate, butyl acetate, diethylene glycol dimethyl ether, diethylene glycol dimethyl ethyl ether, methyl methoxy propionic acid, ethyl ethoxy propionic acid, ethyl lactic acid, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethyl formamide (DMF), N,N-dimethyl acetamide (DMAc), N-methyl-2-pyrrolidone, γ-butyrolactone, diethyl ether, ethylene glycol dimethyl ether, diglyme, tetrahydrofuran, acetyl acetone, and acetonitrile, but is not limited thereto.

The solution including a first metal precursor and a second metal precursor may be prepared by a process including preparing a first solution including the first metal precursor and a first acid catalyst, preparing a second solution including the second metal precursor and a second acid catalyst, and mixing the first solution and the second solution.

The first acid catalyst and the second acid catalyst may help hydrolysis and condensation reactions of the first metal precursor and the second metal precursor, respectively. The first acid catalyst and the second catalyst may be the same or different, and for example, may be a weak acid-weak acid, a weak acid-strong acid, a strong acid-weak acid, or a strong acid-strong acid depending on reactivity of the first metal precursor and the second metal precursor. Herein, the weak acid may be, for example, acetic acid, and the strong acid may be, for example, hydrochloric acid, but they are not limited thereto.

The method may further include heat-treating the solution at about 30 to about 70° C. The heat-treating within the temperature range may promote formation of an oxide between metals having different reactivities from each other.

The hybrid metal oxide having a network structure formed through a sol-gel process may include the first metal, oxygen atom, and the second metal linked through a covalent bond, and at least one of the first metal and the second metal may have two or more oxidation states. In other words, the hybrid metal oxide may include an oxygen atom that is covalently bonded to a first metal and a second metal.

For example, the second metal may have two or more oxidation states, and at least one oxidation states may have conductivity. The second metal precursor may be included in an amount of less than or equal to about 50 mol % based on the total amount of the first metal precursor and the second metal precursor. Within the above range, a binding proportion ratio between heterogeneous atoms may be increased, and a part where the first metal, oxygen atom, and the second metal are linked through a covalent bond may be formed. Within the above range, the second metal may have two or more oxidation states including a conductive oxidation state. Within the above range, the second metal may be included in an amount of about 0.1 to about 50 mol %.

The first metal and the second metal may be, for example, independently selected from titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn), but are not limited thereto.

For example, when the first metal is titanium (Ti) and the second metal is silicon (Si), the first metal precursor may be, for example, titanium tetraisopropoxide (TIPS) and the second metal precursor may be, for example, tetraethyl orthosilicate (TEOS). The tetraethyl orthosilicate (TEOS) may be included in an amount of less than or equal to about 50 mol % based on the total amount of titanium tetraisopropoxide (TIPS) and tetraethyl orthosilicate (TEOS), and accordingly the silicon (Si) in the hybrid metal oxide may simultaneously have a conductive trivalent and non-conductive tetravalent oxidation states. Herein, as an amount of tetraethyl orthosilicate (TEOS) becomes low, silicon (Si) tends to be more reduced, and accordingly a ratio of silicon (Si) having a conductive trivalent oxidation state may increase.

Hereinafter, a solar cell including the hybrid metal oxide according to example embodiments is described.

Herein, as an example of a solar cell, an organic solar cell is illustrated.

Figure 2:
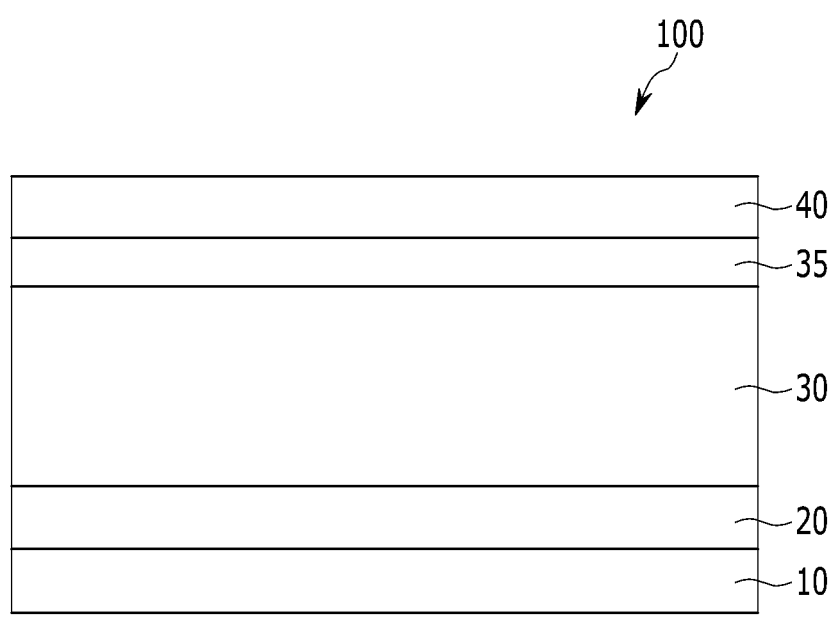
FIG. 2 is a cross-sectional view of an organic solar cell according to example embodiments.

FIG. 2 is a cross-sectional view of an organic solar cell according to example embodiments.

Referring to FIG. 2, an organic solar cell 100 according to example embodiments includes a substrate 10, an anode 20, a photoactive layer 30, an interlayer 35, and a cathode 40.

The substrate 10 may be made of a transparent material, for example an inorganic material such as glass or an organic material such as polycarbonate, polymethylmethacrylate, polyethylene terephthalate, polyethylene naphthalate, polyamide, and polyethersulfone.

The anode 20 may be made of a transparent conductive oxide such as indium tin oxide (ITO), indium zinc oxide (IZO), tin oxide ($SnO_2$), aluminum doped zinc oxide (AZO), gallium doped zinc oxide (GZO), and the like.

The cathode 40 may be made of an opaque conductor such as aluminum (Al), silver (Ag), gold (Au), lithium (Li), and the like.

The photoactive layer 30 may include a photoactive material, and the photoactive material includes an electron acceptor made of an n-type semiconductor material, and an electron donor made of a p-type semiconductor material.

The electron acceptor and electron donor may form, for example, a bulk heterojunction structure. When at least two kinds of the photoactive materials having different energy levels from each other form a bulk heterojunction, a material having relatively low LUMO (lowest unoccupied molecular orbital) level is used as an electron acceptor, and a material having relatively high LUMO level is used as an electron donor.

In the bulk heterojunction, when the electron-hole pair excited by light absorbed in the photoactive layer 30 reaches the interface of the electron acceptor and electron donor by diffusion, electrons and holes are separated by the electron affinity difference of the two materials for the interface, and electrons are moved to the cathode through the electron acceptor and holes are moved to the anode through the electron donor, so as to generate a photocurrent.

The photoactive material may include, for example, at least two selected from: polyaniline; polypyrrole; polythiophene; poly(p-phenylenevinylene); benzodithiophene; thienothiophene; MEH-PPV (poly(2-methoxy-5-(2'-ethylhexyloxy)-1,4-phenylene)vinylene); MDMO-PPV (poly(2-methoxy-5-(3,7-dimethyloctyloxy)-1,4-phenylene-vinylene)); pentacene; perylene; PEDOT (poly(3,4-ethylene dioxythiophene)); poly(3-alkylthiophene); PTB1 (poly((4,8-bis(octyloxy)benzo[1,2-b:4,5-b']dithiophen)-2,6-diyl-alt-(2-((dodecyloxy)carbonyl)thieno[3,4-b]thiophen)-3,6-diyl)); PTB7 (poly((4,8-bis(2-ethylhexyloxy)benzo[1,2-b:4,5-b']dithiophen)-2,6-diyl-alt-(2-((2-ethylhexyloxy)carbonyl)-3-fluorothieno[3,4-b]thiophen)-3,6-diyl)); phthalocyanine; SnPc (tin(II) phthalocyanine); copper phthalocyanine; triarylamine; benzidine; pyrazoline; styrylamine; hydrazone; carbazole; thiophene; 3,4-ethylene dioxythiophene (EDOT); pyrrole; phenanthrene; tetracene; naphthalene; rubrene; NTCDA (1,4,5,8-naphthalene-tetracarboxylic dianhydride); $Alq_3$; fullerene (C60, C70, C74, C76, C78, C82, C84, C720, C860, and the like); a fullerene derivative such as 1-(3-methoxy-carbonyl)propyl-1-phenyl(6,6)C61 (PCBM), C71-PCBM, C84-PCBM, bis-PCBM; an inorganic semiconductor such as CdS, CdTe, CdSe, ZnO, and the like; a derivative thereof; and a copolymer thereof, but is not limited thereto.

The interlayer 35 may be made of a hybrid metal oxide according to example embodiments. As described above, a hybrid metal oxide according to example embodiments may have improved conductivity, energy level, and bandgap within desired (and/or alternatively predetermined) ranges, and may increase mobility of charges from the photoactive layer 30 to the cathode 40. The interlayer 35 may efficiently transfer electrons generated in the photoactive layer 30 to the cathode 40, and reduce (and/or block) hole transfer to the cathode 40 to reduce (and/or prevent) charge loss by recombination of electrons and holes. Thereby, the efficiency of an organic solar cell may be enhanced.

Hereinafter, non-limiting examples and comparative examples are described.

Preparation of Hybrid Metal Oxide Solution

Synthesis Example 1

48.5 g (61.2 ml) of methanol is put in a flask, 46.9 g (50.0 ml) of titanium tetraisopropoxide (TIP) is slowly added thereto, and 9.78 g (9.32 ml) of acetic acid is added thereto in a dropwise fashion. The mixture is agitated for 30 minutes. The agitated mixture is slowly supplied with a solution including 0.347 g (0.369 ml) of tetraethyl orthosilicate (TEOS) and 0.00167 ml of 37% hydrochloric acid. The resulting mixture is agitated for 30 minutes. Herein, the solution respectively includes 99 mol % of the titanium tetraisopropoxide and 1 mol % of the tetraethyl orthosilicate. Then, 3.00 g of deionized water is added thereto in a dropwise fashion. The resulting mixture is heated at 60° C. for 4 hours and then agitated at room temperature for a day, obtaining a hybrid metal oxide solution (HMO1) in a sol state.

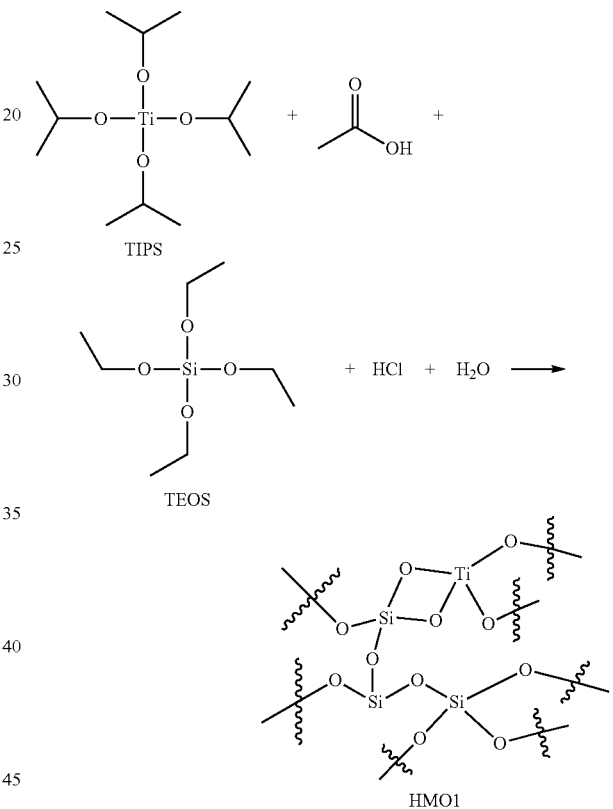

Synthesis Example 2

A hybrid metal oxide solution is prepared according to the same method as Synthesis Example 1, except for including 95 mol % of the titanium tetraisopropoxide and 5 mol % of the tetraethyl orthosilicate therein.

Synthesis Example 3

A hybrid metal oxide solution is prepared according to the same method as Synthesis Example 1, except for including 50 mol % of the titanium tetraisopropoxide and 50 mol % of the tetraethyl orthosilicate therein.

Comparative Synthesis Example 1

A hybrid metal oxide solution is prepared according to the same method as Synthesis Example 1, except no tetraethyl orthosilicate is included.

Comparative Synthesis Example 2

A hybrid metal oxide solution is prepared according to the same method as Synthesis Example 1, except no titanium tetraisopropoxide is included.

Formation of Oxide Thin Film

Example 1

The hybrid metal oxide solution according to Synthesis Example 1 is spin-coated on a glass substrate and dried at room temperature, forming a metal oxide thin film.

Example 2

The hybrid metal oxide solution according to Synthesis Example 2 is spin-coated on a glass substrate and dried at room temperature, forming a metal oxide thin film.

Example 3

The hybrid metal oxide solution according to Synthesis Example 3 is spin-coated on a glass substrate and dried at room temperature, forming a metal oxide thin film.

Comparative Example 1

The hybrid metal oxide solution according to Comparative Synthesis Example 1 is spin-coated on a glass substrate and dried at room temperature, forming a metal oxide thin film.

Comparative Example 2

The hybrid metal oxide solution according to Comparative Synthesis Example 2 is spin-coated on a glass substrate and dried at room temperature, forming a metal oxide thin film.

Analysis 1

The metal oxide thin films according to Examples 1 to 3 and Comparative Examples 1 and 2 are analyzed using an FT-IR spectrometer.

Figure 3:
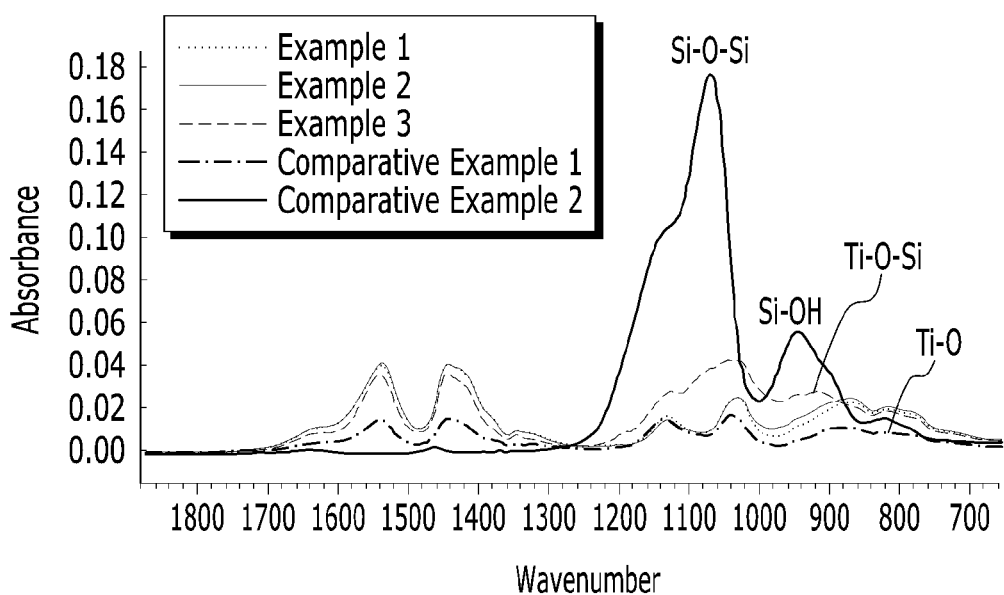
FIG. 3 is an FT-IR graph showing an atom covalent bonding state of the metal oxide thin films according to Examples 1 to 3 and Comparative Examples 1 and 2.

FIG. 3 is a FT-IR graph showing the atom covalent bond of the metal oxide thin films according to Examples 1 to 3 and Comparative Examples 1 and 2.

Referring to FIG. 3, the metal oxide thin films according to Examples 1 to 3 show a peak around 920 cm$^{-1}$, and are identified to have a covalent bond of titanium (Ti)-oxygen (O)-silicon (Si). On the contrary, the metal oxide thin films according to Comparative Examples 1 and 2 do not have the peak.

Analysis 2

The metal oxide thin films according to Examples 1 to 3 and Comparative Example 2 are analyzed regarding oxidation state of silicon (Si) using XPS.

The oxidation state of silicon (Si) of the metal oxide thin films according to Examples 1 to 3 is analyzed by an XPS peak shift with reference to the metal oxide thin film ($SiO_2$ thin film) according to Comparative Example 2.

Figure 4:
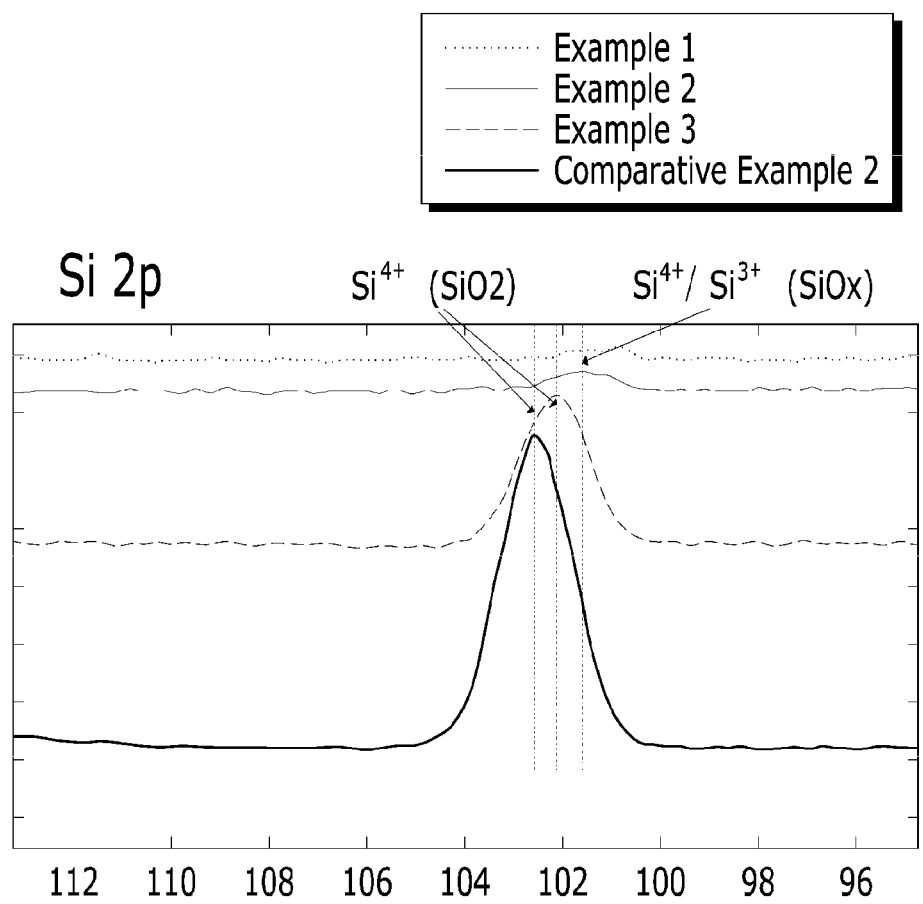
FIG. 4 is an XPS graph showing an oxidation state of silicon (Si) of the metal oxide thin films according to Examples 1 to 3 and Comparative Example 2.

FIG. 4 is an XPS graph showing the oxidation state of silicon (Si) in the metal oxide thin films according to Examples 1 to 3 and Comparative Example 2.

Referring to FIG. 4, the metal oxide thin film according to Comparative Example 2 has a peak at about 102.5 eV (a reference peak: bonding energy of silicon (Si) having a tetravalent oxidation state, that is, bonding energy of silicon (Si) and oxygen (O) in $SiO_2$), while the metal oxide thin films according to Examples 1 to 3 include silicon (Si) having trivalent and tetravalent oxidation states and have a peak that is shifted to the right from the reference peak.

Evaluation 1: Measurement of Bandgap

The metal oxide thin films according to Examples 1 to 3 are measured regarding bandgap. The bandgap is obtained from the edge of an absorption peak in the UV-vis absorption spectra of the metal oxide thin films. In addition, the metal oxide thin films are evaluated regarding work function by spin-coating a metal oxide on an ITO glass and measuring a UPS (ultraviolet photoelectron spectroscopy) spectrum.

The results are provided in Table 1.

TABLE 1

| | Work function (eV) | Bandgap $E_g$ (eV) |
|---|---|---|
| Example 1 | 3.877 | 3.75 |
| Example 2 | 3.877 | 3.77 |
| Example 3 | 3.981 | 3.82 |
| Comparative Example 1 | 3.76 | 3.73 |
| Comparative Example 2 | 4.12 | N/A |

* N/A: too large a bandgap to be measured within a UV-vis absorption range.

Referring to Table 1, the metal oxide thin films according to Examples 1 to 3 have an appropriate work function and bandgap for an interlayer of an organic solar cell.

In addition, the metal oxide thin film according to Example 3 has a higher work function compared to Examples 1-2. Accordingly, a metal oxide thin film having the higher Si mole ratio has an n-type (C70-PCBM) LUMO energy level (−4.0 eV) and an energy level close to the work function (4.06-4.26 eV) of an Al cathode and resultantly may increase mobility of electrons. In addition, as a metal oxide thin film has the higher Si mole ratio, the metal oxide thin film has a larger bandgap and thus may more increasingly reduce (and/or block) holes.

Accordingly, the metal oxide thin films according to Examples 1 to 3 selectively move charges and thus play a role of an interlayer.

Fabrication of Organic Solar Cell

Example 4

A 150 nm-thick anode is fabricated by sputtering indium tin oxide (ITO) on a transparent glass substrate. Next, a 30 nm-thick PEDOT:PSS (poly(3,4-ethylene dioxythiophene):poly(styrene sulfonate)) is spin-coated on the anode. The resulting product is fired for one hour.

Then, a mixture of 8 mg of an electron-donating polymer (poly((4,8-bis(5-(2-ethylhexyl)thienyl)benzo[1,2-b:4,5-b'] dithiophen)-2,6-diyl-alt-(5-ethoxy-5-oxopentyl-3-fluorothieno[3,4-b]thiophene-2-carboxylate)-3,6-diyl, DTBOEOPF) and 16 mg of C70-PCBM is spin-coated (at 2000 rpm) to form a 65 nm thick photoactive layer on the PEDOT:PSS layer.

Subsequently, the hybrid metal oxide solution according to Synthesis Example 1 is coated on the photoactive layer and dried at room temperature to form an interlayer. Next, an 80 nm-thick Al cathode is thermally deposited, fabricating an organic solar cell.

Example 5

An organic solar cell is fabricated according to the same method as Example 4, except for using the hybrid metal oxide solution according to Synthesis Example 2 instead of the hybrid metal oxide solution according to Synthesis Example 1.

Example 6

An organic solar cell is fabricated according to the same method as Example 4, except for using the hybrid metal oxide solution according to Synthesis Example 3 instead of the hybrid metal oxide solution according to Synthesis Example 1.

Comparative Example 3

An organic solar cell is fabricated according to the same method as Example 4, except for using the hybrid metal oxide solution according to Comparative Synthesis Example 1 instead of the hybrid metal oxide solution according to Synthesis Example 1.

Comparative Example 4

An organic solar cell is fabricated according to the same method as Example 4, except for using the hybrid metal oxide solution according to Comparative Synthesis Example 2 instead of the hybrid metal oxide solution according to Synthesis Example 1.

Comparative Example 5

An organic solar cell is fabricated according to the same method as Example 4, except for depositing LiF instead of the hybrid metal oxide solution according to Synthesis Example 1.

Comparative Example 6

An organic solar cell is fabricated according to the same method as Example 4, except for depositing Ca instead of the hybrid metal oxide solution according to Synthesis Example 1.

Evaluation 2: Photocurrent Characteristics

The organic solar cells according to Examples 4 to 6 and Comparative Examples 3 to 6 are measured regarding photocurrent voltage. Then, the open-circuit voltage (Voc), short-circuit current (Jsc), and fill factor (FF) of the organic solar cells are calculated from the photocurrent curve. In addition, the solar cells are evaluated regarding efficiency (η) based on the open-circuit voltage (Voc), short-circuit current (Jsc), and fill factor (FF) results.

Figure 5:
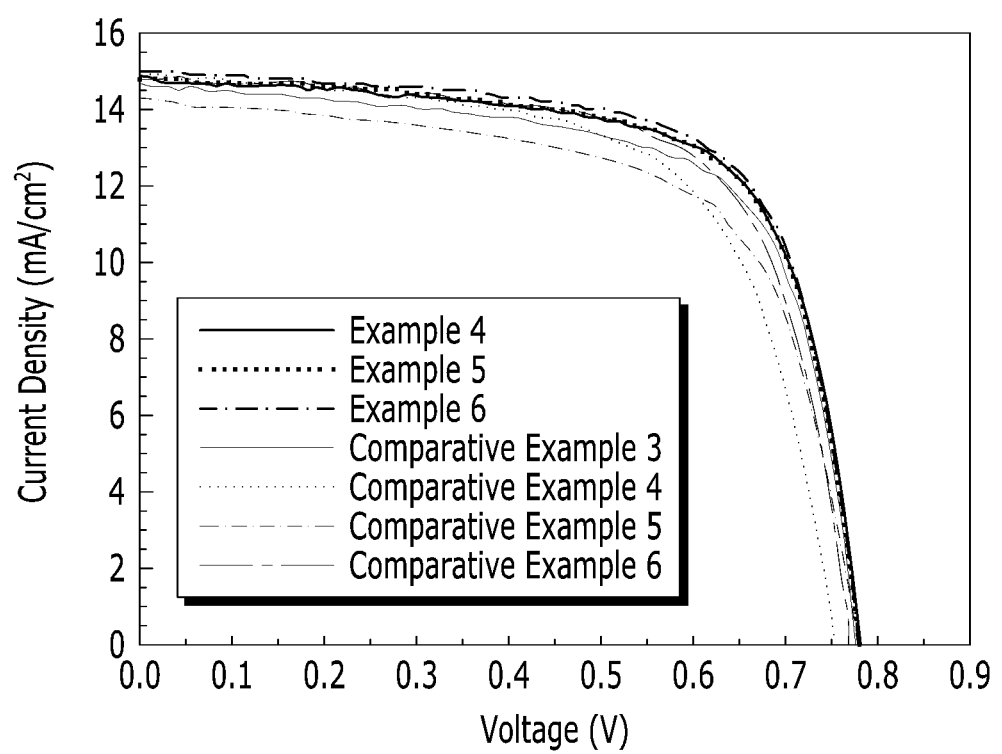
FIG. 5 is a graph showing photocurrent characteristics of the organic solar cells according to Examples 4 to 6 and Comparative Examples 3 to 6.

The results are provided in Table 3 and FIG. 5.

FIG. 5 is a graph showing photocurrent characteristic of the organic solar cells according to Examples 4 to 6 and Comparative Examples 3 to 6.

TABLE 2

|  | Voc (mV) | Jsc (mA/cm$^2$) | FF (%) | Efficiency (%) |
| --- | --- | --- | --- | --- |
| Example 4 | 776.1 | 14.7 | 70.0 | 7.99 |
| Example 5 | 776.1 | 14.9 | 69.0 | 7.98 |
| Example 6 | 776.1 | 15.1 | 69.4 | 8.13 |
| Comparative Example 3 | 776.1 | 14.6 | 69.2 | 7.84 |
| Comparative Example 4 | 756.0 | 14.9 | 63.7 | 7.18 |
| Comparative Example 5 | 776.1 | 14.3 | 64.8 | 7.19 |
| Comparative Example 6 | 766.1 | 14.9 | 67.4 | 7.69 |

Referring to Table 3 and FIG. 5, the organic solar cells according to Examples 4 to 6 have higher current density and efficiency than the ones according to Comparative Examples 3 to 6.

Although FIG. 2 illustrates an organic solar cell 100 including one interlayer 35, example embodiments are not limited thereto. For example, a solar cell alternatively may include a multilayer structure of at least two hybrid metal oxide thin films according to example embodiments instead of the interlayer 35 described above. In a multilayer structure according to example embodiments, two of the hybrid metal oxide thin films may have the same or different concentration ratios of the first metal and the second metal. Alternatively, in a multilayer structure according to example embodiments, two of the hybrid metal oxide thin films may have different metals for their first metal and second metal, respectively.

Figure 6A:
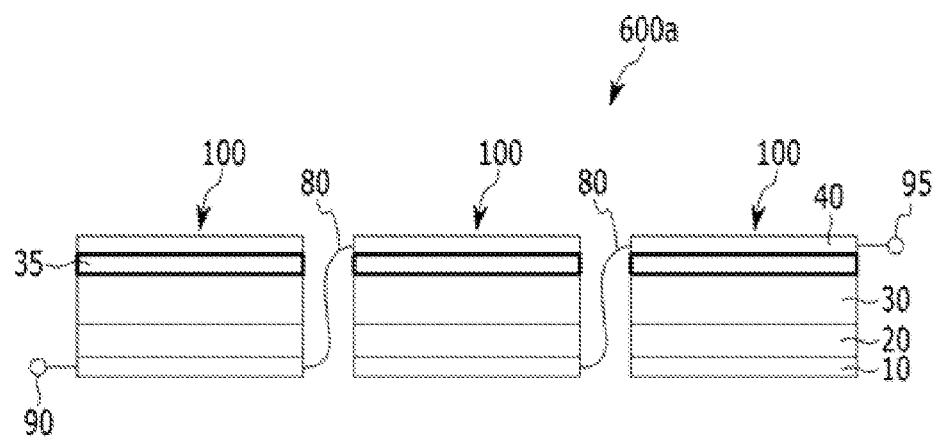
FIGS. 6A and 6B are cross-sectional views of organic solar cell modules according to example embodiments
Figure 6B:
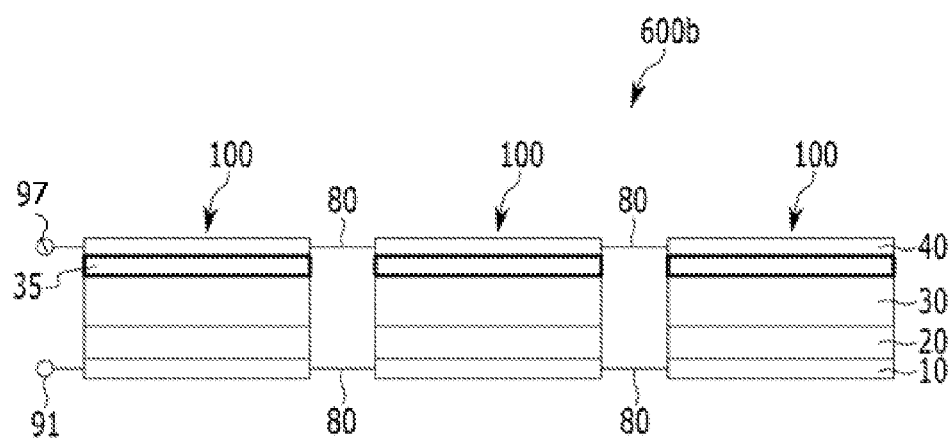

FIGS. 6A and 6B are cross-sectional views of organic solar cell modules according to example embodiments.

Referring to FIG. 6A, a solar module 600a according to example embodiments may include two or more organic solar cells 100 electrically connected to each other in series by wires 80. The solar module 600a may include terminals 90 and 95 for withdrawing power.

Referring to FIG. 6B, a solar module 600b according to example embodiments may include two or more organic solar cells 100 electrically connected to each other in parallel by wires 80. The solar module 600b may include terminals 91 and 97 for withdrawing power.

While FIGS. 6A and 6B show two or more organic solar cells 100 electrically connected to each other in series and parallel, example embodiments are not limited thereto. One of ordinary skill in the art would appreciate that two or more organic solar cells may be electrically connected in series, parallel, and/or series-parallel in order to achieve a desired power output.

While FIG. 2 illustrates an organic solar cell 100 including an interlayer 35 made of a hybrid metal oxide layer according to example embodiments, a hybrid metal oxide layer according to example embodiments may be used other types electronic devices. For example, an organic light emitting diode according to example embodiments may a substrate, an electroluminescent material sandwiched between two electrodes on the substrate, and an interlayer made of a hybrid metal oxide layer according to example embodiments between the electroluminescent material and one of the pair of electrodes.

While some example embodiments have been particularly shown and described, it will be understood by one of ordinary skill in the art that variations in form and detail may be made therein without departing from the spirit and scope of the claims.

What is claimed is:

1. A hybrid metal oxide comprising a network structure including an oxygen atom that is covalently bonded to a first metal and a second metal, the first metal and the second metal being different from each other, and wherein said hybrid metal oxide contains at least one of the first metal and the second metal in two or more simultaneous oxidation states.

2. The hybrid metal oxide of claim 1, wherein the hybrid metal oxide is represented by the following Chemical Formula 1:

$$M^1O_{2-x}M^2O_x \qquad \text{[Chemical Formula 1]}$$

wherein, in Chemical Formula 1,
M$^1$ is the first metal,
M$^2$ is the second metal, and
0.01≤x≤0.99.

3. The hybrid metal oxide of claim 1, wherein
at least one of the first metal and the second metal has at least two oxidation states selected from divalence, trivalence, and tetravalence, and
at least one of the at least two oxidation states is a conductive oxidation state.

4. The hybrid metal oxide of claim 1, wherein
the second metal has two or more oxidation states, and
the second metal is included in an amount of about 0.1 mol % to about 50 mol % based on a total amount of the first metal and the second metal.

5. The hybrid metal oxide of claim 1, wherein the hybrid metal oxide comprises at least one amorphous part.

6. The hybrid metal oxide of claim 1, wherein the first metal and the second metal are independently different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

7. The hybrid metal oxide of claim 6, wherein
the first metal is titanium (Ti),
the second metal is silicon (Si),
the silicon (Si) has trivalent and tetravalent oxidation states, and
the silicon (Si) is included in an amount of about 0.1 mol % to about 50 mol % based on a total amount of the titanium (Ti) and silicon (Si).

8. The hybrid metal oxide of claim 1, wherein
a conductivity of the hybrid metal oxide is about $10^{-6}$ to about 10 S/cm, and
a work function of the hybrid metal oxide is about 3.0 to about 8.5 eV.

9. A method comprising:
preparing a solution including a first metal precursor and a second metal precursor; and
forming the hybrid metal oxide of claim 1 from the solution through a sol-gel process.

10. The method of claim 9, wherein the preparing the solution includes:
preparing a first solution including the first metal precursor and a first acid catalyst;
preparing a second solution including the second metal precursor and a second acid catalyst; and
mixing the first solution and the second solution.

11. The method of claim 9, further comprising:
heat-treating the solution at about 30° C. to about 70° C.

12. The method of claim 9, wherein the first metal and the second metal are independently different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

13. A solar cell comprising:
an anode;
a cathode on the anode;
a photoactive layer between the anode and the cathode; and
an interlayer between the cathode and the photoactive layer,
the interlayer including the hybrid metal oxide of claim 1.

14. The solar cell of claim 13, wherein the hybrid metal oxide is represented by the following Chemical Formula 1:

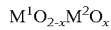     [Chemical Formula 1]

wherein, in Chemical Formula 1,
$M^1$ is the first metal,
$M^2$ is the second metal, and
$0.01 \leq x \leq 0.99$.

15. The solar cell of claim 13, wherein
at least one of the first metal and the second metal has at least two oxidation states selected from divalence, trivalence, and tetravalence, and
at least one of the at least two oxidation states is a conductive oxidation state.

16. The solar cell of claim 13, wherein
the second metal has two or more oxidation states, and
the second metal is included in an amount of about 0.1 mol % to about 50 mol % based on a total amount of the first metal and the second metal.

17. The solar cell of claim 13, wherein the hybrid metal oxide comprises at least one amorphous part.

18. The solar cell of claim 13, wherein the first metal and the second metal are independently different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

19. The solar cell of claim 18, wherein
the first metal is titanium (Ti),
the second metal is silicon (Si),
the silicon (Si) has trivalent and tetravalent oxidation states, and
the silicon (Si) is included in an amount of about 0.1 mol % to about 50 mol % based on the total amount of the titanium (Ti) and silicon (Si).

20. The solar cell of claim 13, wherein
a conductivity of the hybrid metal oxide is about $10^{-6}$ to about 10 S/cm, and
a bandgap of the hybrid metal oxide is about 3.0 to about 8.5 eV.

21. A hybrid metal oxide comprising: a plurality of first metal atoms; a plurality of second metal atoms, the second metal atoms being different from the first metal atoms, at least one of the first metal atoms and the second metal atoms being contained in the hybrid metal oxide in at least two simultaneous oxidation states; a plurality of oxygen atoms, a first portion of the plurality of oxygen atoms each being covalently bonded to a corresponding one of the plurality of first metal atoms and a corresponding one of the plurality of second metal atoms.

22. The hybrid metal oxide of claim 21, wherein
the plurality of first metal atoms are titanium (Ti),
the plurality of second metal atoms are silicon (Si),
the silicon (Si) has trivalent and tetravalent oxidation states, and
the silicon (Si) is included in an amount of about 0.1 mol % to about 50 mol % based on the total amount of the titanium (Ti) and silicon (Si).

23. The hybrid metal oxide of claim 21, wherein
a second portion of the plurality of oxygen atoms are each covalently bonded to a corresponding two of the plurality of first metal atoms; and
a third portion of the plurality of oxygen atoms are each covalently bonded to a corresponding two of the plurality of second metal atoms.

24. The hybrid metal oxide of claim 21, wherein the plurality of first metal atoms and the plurality of second metal atoms are independently different ones of titanium (Ti), zinc (Zn), strontium (Sr), barium (Ba), iron (Fe), nickel (Ni), copper (Cu), silver (Ag), platinum (Pt), tungsten (W), silicon (Si), germanium (Ge), and tin (Sn).

25. A solar cell comprising:
an anode;
a cathode on the anode;
a photoactive layer between the anode and the cathode; and an interlayer between the cathode and the photoactive layer,
the interlayer including the hybrid metal oxide of claim 21.

* * * * *